United States Patent

Bedarida et al.

(10) Patent No.: US 6,385,107 B1
(45) Date of Patent: May 7, 2002

(54) ARCHITECTURE FOR HANDLING INTERNAL VOLTAGES IN A NON-VOLATILE MEMORY, PARTICULARLY IN A SINGLE-VOLTAGE SUPPLY TYPE OF DUAL-WORK FLASH MEMORY

(75) Inventors: Lorenzo Bedarida, Vimercate; Simone Bartoli, Cambiago; Mauro Sali, Sant'Angelo Lodigiano; Antonio Russo, Trezzo Sull'Adda, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/710,067

(22) Filed: Nov. 9, 2000

(30) Foreign Application Priority Data

Nov. 12, 1999 (IT) .......................... MI99A2372

(51) Int. Cl.$^7$ ................................. G11C 7/02
(52) U.S. Cl. .................. 365/206; 365/185.11
(58) Field of Search .................. 365/206, 189.09, 365/189.11, 185.11, 185.19, 185.27

(56) References Cited

U.S. PATENT DOCUMENTS

| | | | | |
|---|---|---|---|---|
| 5,075,890 A | * | 12/1991 | Itoh et al. | 365/189.09 |
| 5,297,096 A | * | 3/1994 | Terada et al. | 365/218 |
| 5,381,366 A | * | 1/1995 | Kawauchi et al. | 365/185 |
| 5,754,482 A | * | 5/1998 | Su et al. | 365/189.07 |
| 5,892,715 A | * | 4/1999 | Hirata et al. | 365/185.29 |
| 6,044,033 A | * | 3/2000 | Jang | 365/230.03 |

* cited by examiner

*Primary Examiner*—Vu A. Le
*Assistant Examiner*—Anh Phung
(74) *Attorney, Agent, or Firm*—Lisa K. Jorgenson; Robert Iannucci; Seed IP Law Group PLLC

(57) ABSTRACT

An architecture handles internal voltages in a non-volatile memory array which is split into at least first and second mutually independent banks. The architecture includes first and second pluralities of generators for generating at least one of the internal voltages, which are separate from each other and connected to the first and second banks, respectively, of the nonvolatile memory array; and a control system connected to the pluralities of generators to handle the correct activation of the different generators in the different conditions of the memory array operation.

10 Claims, 2 Drawing Sheets

ARCHITECTURE FOR HANDLING INTERNAL VOLTAGES IN A NON-VOLATILE MEMORY, PARTICULARLY IN A SINGLE-VOLTAGE SUPPLY TYPE OF DUAL-WORK FLASH MEMORY

TECHNICAL FIELD

This invention relates to an architecture for handling internal voltages in a non-volatile memory.

Specifically, the invention relates to an architecture for handling internal voltages in a non-volatile memory array which is split into first and second mutually independent banks.

The invention relates, particularly but not exclusively, to an architecture for handling internal voltages in a non-volatile memory of the dual-work flash type having a single-voltage supply, and the description to follow will cover this field of application for simplicity's sake.

BACKGROUND OF THE INVENTION

As is well known, although non-volatile memories have attained read speeds far above those available but few years ago, little has been achieved in the respect of modify speed, i.e., memory cell program and erase speed.

In fact, modify operations obey the physics that governs the working of nonvolatile memory cells.

In particular, an erase operation may take as long as hundreds of milliseconds, during which time a memory cannot fill requests for reading from a microprocessor arranged to control the memory operation.

To obviate this problem of operational speed, a new generation of storage devices has been developed in the form of dual-work flash memory devices. These devices are split internally into two independent banks, wherein one bank can be read while the other bank is being erased.

There exists currently a demand for non-volatile storage devices to operate on a single supply voltage: these are usually referred to as single-voltage devices. Furthermore, the value of the device operating voltage has moved from 5V to 1.8V, thereby creating a need for the voltages used within the storage device during the memory cell modify operations to be generated, handled and regulated by special charge pump circuits.

In particular, standard voltage values for application to the gate terminal of a memory cell during modify operations may be:

10V for programming, and
−9V for erasing.

For dual-work flash memories wherein the memory array is split into two banks independent of each other, handling internally generated voltages for cell modify operations proves to be complicated, since a requisite is that one bank can be modified simultaneously as the other is being read.

SUMMARY OF THE INVENTION

An embodiment of this invention provides a method of handling the internal voltages of a non-volatile memory, having such structural and functional features as to be applicable to dual-work storage devices, specifically single-voltage storage devices.

A concept behind this invention is one of duplicating the charge pump circuits provided to generate the internal voltages needed for the memory to operate, and introducing a control system for the operation of those circuits so as to ensure proper working of the memory as a whole.

The features and advantages of an architecture according to this invention will be apparent from the following description of an embodiment thereof, given by way of example and not of limitation with reference to the accompanying drawings.

An embodiment of the invention is directed to an architecture for handling internal voltages in a non-volatile memory array that is split into first and second mutually independent banks. The architecture includes first and second pluralities of generators for generating at least one of said internal voltages. The pluralities of generators are separate from each other and connected to the first and second banks, respectively, of the nonvolatile memory array. The architecture also includes a control system connected to the pluralities of generators to correctly activate the different generators in different conditions of the memory array operation.

DETAILED DESCRIPTION OF THE INVENTION

Figure 1:
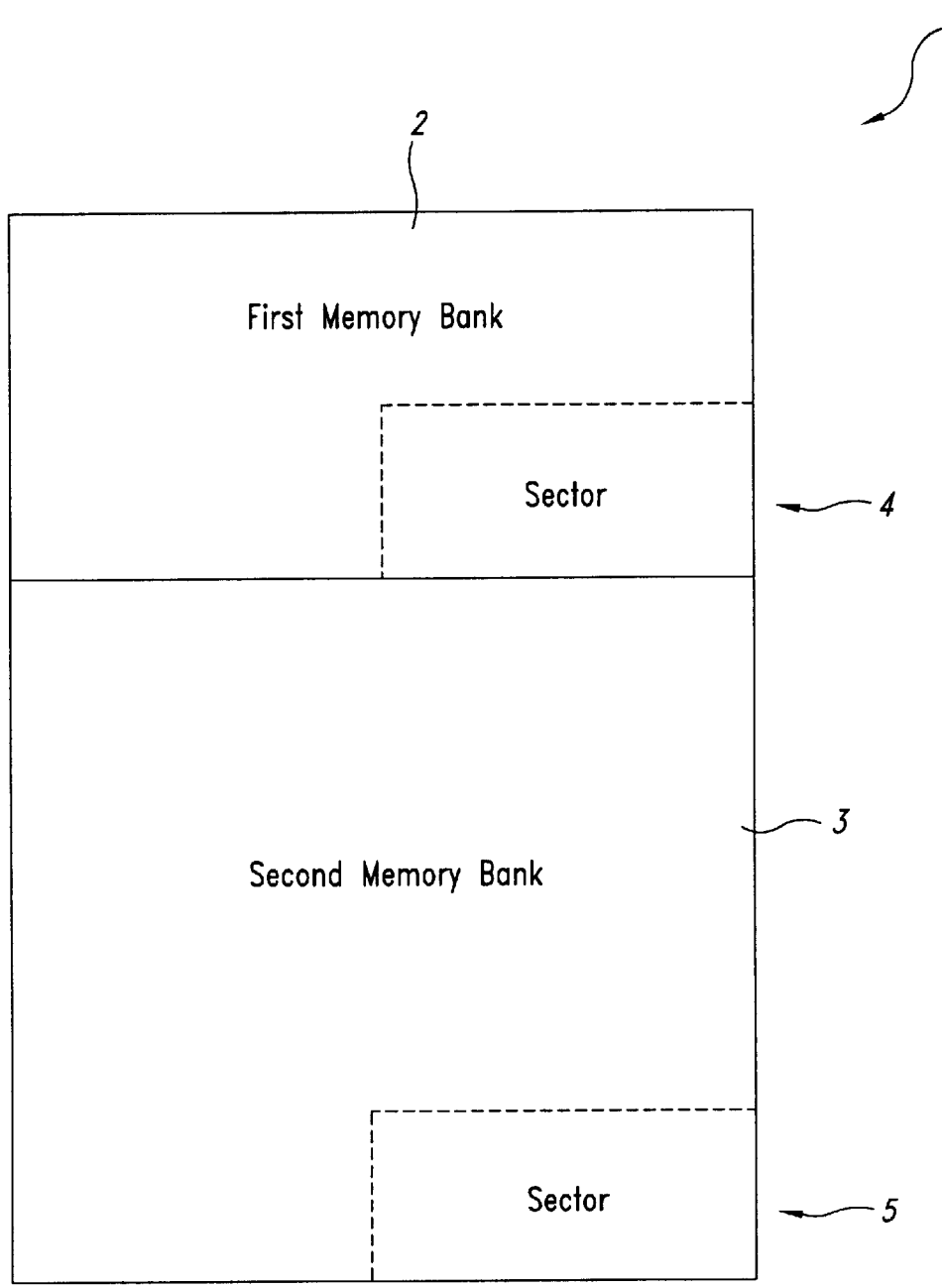
FIG. 1 shows schematically a dual-work memory array.

With reference to the drawing views, in particular to FIG. 1, a memory array of the dual-work type, i.e., split into first 2 and second 3 mutually independent banks, is shown generally at 1. The first bank 2 is involved, at a sector 4 thereof, by a modify (program/erase) operation while a sector 5 of the second bank 3 is being read.

The memory internal voltages, which are generated by special charge pump circuits, are the following:

a first voltage Vpcx being applied to the gate terminals of the cells of the memory array 1 during read and program operations;

a second voltage Vneg being applied to the gate terminals of the cells of the memory array 1 during erase operations;

a third voltage Vpd being applied to the drain terminals of the cells of the memory array 1 during program operations;

a fourth voltage Vsource being applied to the source terminals of the cells of the memory array 1 during erase operations;

a fifth or column decode voltage Vpcy; and a sixth or row decode control voltage Vdep.

Figure 2:
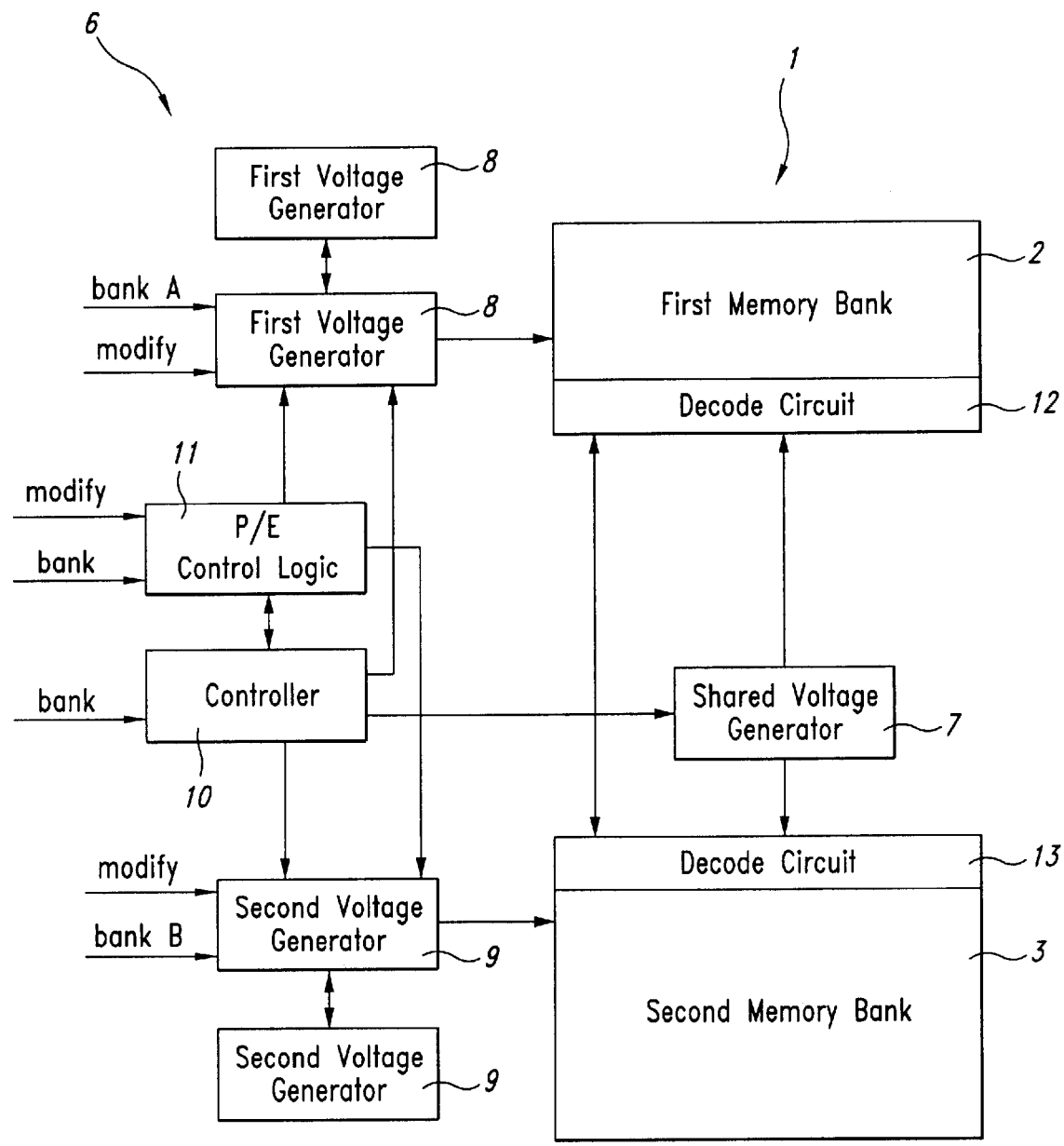
FIG. 2 shows schematically an architecture for generating and handling internal voltages in accordance with the invention.

Shown schematically in FIG. 2 is an architecture 6 for generating and handling internal voltages in a dual-work memory array 1 which comprises a first bank 2 and a second bank 3.

Advantageously, the architecture 6 includes a duplicate of the charge-pump generators associated with said banks 2, 3, but not of the generator 7 providing the drain voltage Vpd. In fact, the generator 7 which generates the voltage Vpd is to supply a large current, and includes charge pumps of a larger size than the charge pumps of the generators of the voltages Vpcx, Vpcy and Vdep., which generators can employ, in a standby condition, low-drain pumps capable of sustaining the leakage currents.

In particular, the architecture 6 is regarded to comprise a first charge-pump generator 8 supplying the voltages Vpcx, Vpcy and Vdep to the first bank 2, and a second charge-pump generator 9 supplying the voltages Vpcx, Vpcy and Vdep to the second bank 3.

In addition, the architecture 6 comprises a charge pump controller 10 connected to the generators 7, 8, 9, and a P/E (Program/erase) control logic 11 connected to the generators 8, 9 and connected to the controller 10. In particular, the controller 10 and control logic 11 handle the correct activation of the different charge pump circuits in the different conditions of the memory array 1 operation.

Advantageously, the first 2 and second 3 banks are provided with decode circuits for the separate program-loads referenced 12 and 13, respectively.

Thus, with the program-loads being essentially switches arranged to connect the generator 7 of the voltage Vpd to a node placed downstream of column decoding in the memory array 1 and connected to the selected bitline, a single charge pump circuit can be used to generate the voltage Vpd, the decode circuits 12 and 13 uncoupling the drain terminals of the memory cells in the bank being read while the memory cells in the other bank are being programmed.

Advantageously, the controller 10 receives a control signal BANK corresponding to the bank affected by the operation to be performed. The control logic 11 receives, additionally to the signal BANK, a signal MODIFY representing a request for a modify (P/E) operation on the array portion enabled by the control signal BANK.

Although the architecture 6 occupies more of the memory area than prior designs, it affords substantial modularity, and hence great freedom in the respect of splitting the memory array 1 in a quick and effective manner.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An architecture for handling internal voltages in a non-volatile memory array which is split into at least first and second mutually independent banks, the architecture comprising:

first and second pluralities of generators for generating at least one of said internal voltages, said first and second pluralities being separate from each other and connected to said first and second banks, respectively, of the non-volatile memory array;

a control system connected to said pluralities of generators to correctly activate the generators in different conditions of the memory array operation; and an internal voltage generator that supplies the memory with a large current to be shared in common by said first and second banks.

2. An architecture according to claim 1 wherein said first and second banks are provided with separate decode circuits connected to said internal voltage generator to decouple memory cell terminals of said first bank from memory cell terminals of the second bank.

3. An architecture according to claim 1 wherein the first and second pluralities of generators include charge pumps and said internal voltage generator comprises charge pumps that are larger than said charge pumps of said pluralities of generators.

4. An architecture for handling internal voltages in a non-volatile memory array which is split into at least first and second mutually independent banks, the architecture comprising:

first and second pluralities of generators for generating at least one of said internal voltages, said first and second pluralities being separate from each other and connected to said first and second banks, respectively, of the non-volatile memory array; and a control system connected to said pluralities of generators to correctly activate the generators in different conditions of the memory array operation; wherein said control system receives at least one control signal corresponding to the affected bank by the operation to be performed, and a signal representing request for a modify operation to be carried out on the, enabled array portion by said control signal.

5. An architecture according to claim 1 wherein said first and second pluralities of generators comprise charge pumps of an appropriate size to restrict overall power consumption by the architecture in a standby condition.

6. A memory device, comprising:

mutually independent first and second memory banks;

a first voltage generator connected to and dedicated exclusively to the first memory bank, the first voltage generator being structured to supply a first internal voltage to the first memory bank;

a second voltage generator connected to and dedicated exclusively to the second memory bank, the second voltage generator being structured to supply a second internal voltage to the second memory bank;

a controller connected to first and second voltage generators to correctly activate the voltage generators in different conditions of the memory device operation; and a third voltage generator connected to both of the first and second memory banks, the third voltage generator being structured to supply a large current to be shared in common by the first and second memory banks.

7. The memory device of claim 6, further comprising first and second decode circuits connected respectively to the first and second memory banks and connected to the third voltage generator to decouple memory cell terminals of the first memory bank from memory cell terminals of the second memory bank.

8. The memory device of claim 6 wherein the first, second, and third voltage generators respectively include first, second, and third charge pumps, the third charge pump being larger than the first and second charge pumps.

9. The memory device of claim 6 wherein the first and second pluralities of generators comprise charge pumps of an appropriate size to restrict overall power consumption by the memory device in a standby condition.

10. A memory device, comprising:

mutually independent first and second memory banks;

a first voltage generator connected to and dedicated exclusively to the first memory bank, the first voltage generator being structured to supply a first internal voltage to the first memory bank;

a second voltage generator connected to and dedicated exclusively to the second; memory bank, the second voltage generator being structured to supply a second internal voltage to the second memory bank;

a controller connected to first and second voltage generators to correctly activate, the voltage generators in different conditions of the memory device operation; and a program/erase logic circuit having a first input that receives a signal indicating that a request to modify one of the memory banks has been received, a second input that receives a signal indicating which of the first and second memory banks is to be modified, and a control output coupled to the controller, the logic circuit being structured to indicated to the controller whether the request to modify is a request to program or a request to erase.

* * * * *